United States Patent
Wang

(10) Patent No.: US 9,965,128 B2
(45) Date of Patent: May 8, 2018

(54) TOUCH SENSING UNIT, TOUCH SUBSTRATE AND METHOD FOR PRODUCING THE SAME, TOUCH DISPLAY PANEL AND TOUCH DISPLAY APPARATUS

(71) Applicant: BOE Technology Group Co., Ltd., Beijing (CN)

(72) Inventor: Xinxing Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 156 days.

(21) Appl. No.: 14/912,658

(22) PCT Filed: Apr. 30, 2015

(86) PCT No.: PCT/CN2015/077966
§ 371 (c)(1),
(2) Date: Feb. 18, 2016

(87) PCT Pub. No.: WO2016/107034
PCT Pub. Date: Jul. 7, 2016

(65) Prior Publication Data
US 2016/0349887 A1    Dec. 1, 2016

(30) Foreign Application Priority Data

Dec. 30, 2014    (CN) .......................... 2014 1 0841677

(51) Int. Cl.
*G06F 3/045*    (2006.01)
*G06F 3/046*    (2006.01)
(Continued)

(52) U.S. Cl.
CPC ............ *G06F 3/046* (2013.01); *G06F 3/0412* (2013.01); *G06F 3/0414* (2013.01);
(Continued)

(58) Field of Classification Search
None
See application file for complete search history.

(56) References Cited

U.S. PATENT DOCUMENTS 9,430,078 B2    8/2016    Cranfill et al.
2005/0285846 A1    12/2005    Funaki
(Continued)

FOREIGN PATENT DOCUMENTS

CN    102214027 A    10/2011
CN    102640093 A    8/2012
(Continued)

OTHER PUBLICATIONS

First Office Action, including Search Report, for Chinese Patent Application No. 201410841677.8, dated Jan. 18, 2017, 15 pages.
(Continued)

*Primary Examiner* — Ifedayo Iluyomade
(74) *Attorney, Agent, or Firm* — Westman, Champlin & Koehler, P.A.

(57) ABSTRACT

The present disclosure provides a touch sensing unit, a touch substrate and a method for producing the touch substrate, a touch display panel and a touch display apparatus. The sensing unit includes: at least one pair of first electrode and second electrode spaced apart from each other; at least one elastic base body in which pressure-sensitive conductive material is contained, the at least one elastic base body forcing the corresponding first electrode and second electrode in the at least one pair of first electrode and second electrode to be electrically connected with each other when it is deformed by a force; and a touch panel arranged at the side of the at least one elastic base body to which the force is applied. It may sense touch action of a finger by conductive property of pressure-sensitive conductive material to improve convenience of finger touching and multiple point touch performance.

16 Claims, 4 Drawing Sheets

(51) Int. Cl.
*G06F 3/041* (2006.01)
*G02F 1/1333* (2006.01)
*G02F 1/1362* (2006.01)
*G02F 1/1368* (2006.01)
*G06F 3/0354* (2013.01)
*H05K 3/06* (2006.01)

(52) U.S. Cl.
CPC ........ *G02F 1/1368* (2013.01); *G02F 1/13338* (2013.01); *G02F 1/136286* (2013.01); *G06F 3/03545* (2013.01); *G06F 2203/04103* (2013.01); *H05K 3/064* (2013.01)

(56) References Cited

U.S. PATENT DOCUMENTS

2008/0143906 A1* 6/2008 Allemand ............... B82Y 10/00
349/43
2012/0313860 A1* 12/2012 Hashimura ............ B82Y 15/00
345/173
2016/0011691 A1* 1/2016 Shinkai ................... G06F 3/044
345/174

FOREIGN PATENT DOCUMENTS

| CN | 102906680 A | | 1/2013 | |
|---|---|---|---|---|
| CN | 102955311 A | | 3/2013 | |
| CN | 104503654 A | | 4/2015 | |
| CN | 204347811 U | | 5/2015 | |
| JP | 2013050859 | * | 3/2013 | ............. G06F 3/041 |
| JP | WO2014141584 | * | 3/2013 | ............. G06F 3/041 |

OTHER PUBLICATIONS

International Search Report and Written Opinion for International Application No. PCT/CN2015/077966, dated Oct. 13, 2015, 9 pages.
English translation of Box No. V of the Written Opinion for the International Searching Authority of International Application No. PCT/CN2015/077966, 2 pages.

* cited by examiner

TOUCH SENSING UNIT, TOUCH SUBSTRATE AND METHOD FOR PRODUCING THE SAME, TOUCH DISPLAY PANEL AND TOUCH DISPLAY APPARATUS

CROSS-REFERENCE TO RELATED APPLICATION

This application is a Section 371 National Stage Application of International Application No. PCT/CN2015/077966, filed Apr. 30, 2015, and has not yet published, which claims priority to Chinese Application No. 201410841677.8, filed on 30 Dec. 2014, entitled "Touch Sensing Unit, Touch Substrate And Method For Producing The Same And Touch Display Panel", incorporated herein by reference in their entirety.

BACKGROUND OF THE INVENTION

Field of the Invention

Embodiments of the present disclosure generally relate to the field of touch display technologies, and in particular, to a touch sensing unit, a touch substrate and a method for producing the touch substrate, a touch display panel and a touch display apparatus.

Description of the Related Art

In field of a panel display, an organic electroluminescence display (OLED) has been widely used in a panel display because its manufacturing apparatus has low cost and its manufacturing process is relatively simple and its panel may emit light by itself to omit backlight source components and reduce thickness of the display panel. As the display technology develops, the touch technology for the display apparatus also develops. For example, the developed touch technology used in the display apparatus includes such as capacitance-sensitive, resistance-sensitive, voltage-sensitive, electromagnetic, infrared touch modes.

As the requirements for user's experiences are improved increasingly, the performance of the touch functional devices in response speed, precision, composite function becomes more and more prominent.

SUMMARY

An embodiment of the present invention provides a touch sensing unit, a touch substrate and a method for producing the touch substrate, a touch display panel and a touch display apparatus, which may sense touch action of a finger or a lettering pen by conductive property of pressure-sensitive conductive material.

An embodiment of the present invention provides a touch sensing unit, a touch substrate and a method for producing the touch substrate, a touch display panel and a touch display apparatus, which may sense touch action of a finger or a lettering pen by conductive property of pressure-sensitive conductive material and sense the input actions of an electromagnetic pen by magnetic material to achieve double touch mode of finger touching and electromagnetic pen touching.

According to an aspect of the present disclosure, it provides a touch sensing unit, comprising:

at least one pair of first electrode and second electrode spaced apart from each other;

at least one elastic base body in which pressure-sensitive conductive material is contained, the at least one elastic base body forcing the corresponding first electrode and second electrode in the at least one pair of first electrode and second electrode to be electrically connected with each other when it is deformed by a force; and a touch panel arranged on the side of the at least one elastic base body to which the force is applied.

In an example, the at least one pair of first electrode and second electrode is arranged to correspond to the at least one elastic base body and the touch panel is spaced apart from the at least one elastic base body.

In an example, the touch sensing unit further comprises a magnetic triggering layer arranged between the touch panel and the at least one elastic base body and on the side of the at least one elastic base body to which the force is applied.

In an example, the pressure-sensitive conductive material comprises at least one of graphene, carbon nanotube, conductive black carbon, metal powders and metal fiber or any combination thereof.

In an example, the at least one elastic base body is made from at least one of acryl resin, ethylene propylene rubber, acrylonitrile butadiene rubber, chloroprene rubber and silicon rubber or any combination thereof.

In an example, the touch panel is made from deformable material that can be deformed due to application of force and is configured to force the at least one elastic base body to deform once it has been deformed due to the application of force.

In an example, the at least one pair of first electrode and second electrode comprises as a plurality of pairs of first electrodes and second electrodes, the first electrode and the second electrode in the corresponding pair of first electrode and second electrode being spaced apart from each other.

In an example, the elastic base body contacts with both electrodes of the pair of first electrode and second electrode.

In an example, the touch sensing unit is arranged in a display panel and the at least one elastic base body is arranged on an inner surface of an upper substrate of the display panel and the first electrode and the second electrode in the at least one pair of first electrode and second electrode are arranged on an inner surface of a lower substrate of the display panel.

According to another aspect of the present disclosure, it provides a touch substrate comprising at least one touch sensing unit as described in any of the above examples.

In an example, the touch substrate further comprises at least one touch transmitting line and at least one touch receiving line, wherein each of the first electrodes is electrically connected to the corresponding touch transmitting line and each of the second electrodes is electrically connected to the corresponding touch receiving line.

In an example, the touch substrate is used in a liquid crystal display panel and is provided with a color filtering unit thereon.

In an example, the touch substrate further comprises a common electrode, wherein the common electrode and the at least one pair of first electrode and second electrode are formed by a same transparent conductive material in a same layer; or the common electrode is covered by a transparent insulating layer and the at least one pair of first electrode and second electrode is formed by a same transparent conductive material on the insulating layer in one patterning process.

According to another aspect of the present disclosure, it provides a touch display panel comprising the touch substrate as described in any of the above examples, an array substrate and a liquid crystal layer between the touch substrate and the array substrate, wherein the array substrate comprises:

a plurality of gate lines and a plurality of data lines, the gate lines and the data lines being arranged to cross with each other to form a plurality of display units; and a plurality of thin film transistors, each of which is arranged in the corresponding display unit and is electrically connected to the corresponding gate line.

In an example, the array substrate comprises a common electrode, and the at least one pair of first electrode and second electrode and the common electrode are formed by a same layer of transparent conductive material in a same patterning process.

In an example, the array substrate comprises a common electrode, and the at least one pair of first electrode and second electrode is located on the side of the common electrode from which light is emitted, and the common electrode and the first electrode of the at least one pair of first electrode and second electrode are spaced apart from each other by a transparent insulating layer therebetween and the common electrode and the second electrode of the at least one pair of first electrode and second electrode are spaced apart from each other by a transparent insulating layer therebetween.

In an example, the gate lines are used as the touch transmitting lines.

In an example, the gate lines are electrically connected to one electrode in the corresponding first electrode and second electrode by vias.

According to another aspect of the present disclosure, it provides a touch display apparatus comprising:

the touch display panel as described in any of the above examples; and an electromagnetic pen having an end which is provided with a contact head including magnetic material, the magnetic material of the contact head having the same magnetic property as that of the magnetic triggering layer.

According to another aspect of the present disclosure, it provides a method for producing a touch substrate, comprising the following steps of:

forming at least one pair of first electrode and second electrode on a first substrate, the first electrode in the at least one pair of first electrode and second electrode is electrically connected to a corresponding touch transmitting line provided in the first substrate and the second electrode in the at least one pair of first electrode and second electrode is electrically connected to a corresponding touch receiving line provided in the first substrate;

forming an elastic layer which contains pressure-sensitive conductive material on the first substrate formed with the at least one pair of first electrode and second electrode;

patterning the elastic layer by a patterning process to form at least one elastic base body; and assembling a second substrate with the first substrate formed with the elastic base body.

In an example, the step of patterning the elastic layer by a patterning process to form at least one elastic base body comprises:

depositing a magnetic material layer on the elastic layer;

patterning the elastic layer and the magnetic material layer by a patterning process; and polarizing the magnetic material layer by magnet such that the magnetic material layer formed on each elastic base body forms a magnetic triggering layer.

In an example, the step of patterning the elastic layer and the magnetic material layer by a patterning process comprises:

depositing a photo resist on the magnetic material layer;

patterning the elastic layer, the magnetic material layer and the photo resist by carrying out exposing, developing and etching processes using a mask; and peeling off the photo resist.

In an example, ashing a surface of an array substrate by oxygen after peeling off the photo resist, such that the residual carbon materials react to generate dioxide carbon.

In an example, the first substrate is an array substrate, and the step of forming at least one pair of first electrode and second electrode on a first substrate comprises: forming a common electrode and the at least one pair of first electrode and second electrode of the array substrate by a same transparent conductive material in one patterning process and electrically connecting the gate lines formed on the array substrate to the corresponding first electrode, such that the gate lines are used as the touch transmitting lines.

In an example, the first substrate is an array substrate, and the step of forming at least one pair of first electrode and second electrode on a first substrate comprises:

covering a transparent insulating layer on a common electrode of the array substrate;

forming the at least one pair of first electrode and second electrode on the insulating layer by a same transparent conductive material in one patterning process; and electrically connecting the gate lines formed on the array substrate to the corresponding first electrode in the at least one pair of first electrode and second electrode by vias formed in the insulating layer, such that the gate lines are used as the touch transmitting lines.

The touch sensing unit, the touch substrate and the method for producing the same, the touch display panel and the touch display apparatus according to the above embodiment of the present invention may sense touch actions of fingers by using the conductive properties of the pressure-sensitive conductive material to improve convenience for finger touch sensing, characteristic for multiple point touch sensing. In addition, the double touch mode of finger touching and electromagnetic pen touching may be achieved by sensing the input actions of the electromagnetic pen by the magnetic material.

BRIEF DESCRIPTION OF THE DRAWINGS

The object, solutions and advantages of the present disclosure will become more apparent and will be understood more clearly though the following description of preferred embodiments made with reference to the accompanying drawings, in which.

DETAILED DESCRIPTION OF PREFERRED EMBODIMENTS OF THE INVENTION

The embodiments of the present invention will be further explained below with reference to the figures and examples. Throughout the description, the same or similar reference numbers indicate the same or similar members. The following embodiments along with the figures are only used to explain the general inventive concept of the present invention, instead of being intended to limit the scope of the present invention.

According to the general inventive concept of the respective illustrative embodiments of the present disclosure, a touch substrate is provided, comprising: at least one pair of first electrode and second electrode; at least one elastic base body in which pressure-sensitive conductive material is contained, the at least one elastic base body forcing the corresponding first electrode and the second electrode in the at least one pair of first electrode and second electrode to be electrically connected with each other when it is deformed by a force; at least one touch transmitting line and at least one touch receiving line, wherein the first electrode of the at least one pair of first electrode and second electrode is electrically connected to the corresponding touch transmitting line and the second electrode of the at least one pair of first electrode and second electrode is electrically connected to the corresponding touch receiving line; and a touch panel arranged on the side of the at least one elastic base body to which the force is applied.

In addition, for the purpose of explanation, numerous specific details are set forth in the following detailed description to provide a thorough understanding to the embodiments of the present invention. It is obvious, however, that one or more embodiments can also be implemented without these specific details. In other instances, well-known structures and devices are shown in an illustrative manner so as to simplify the drawings.

Figure 3:
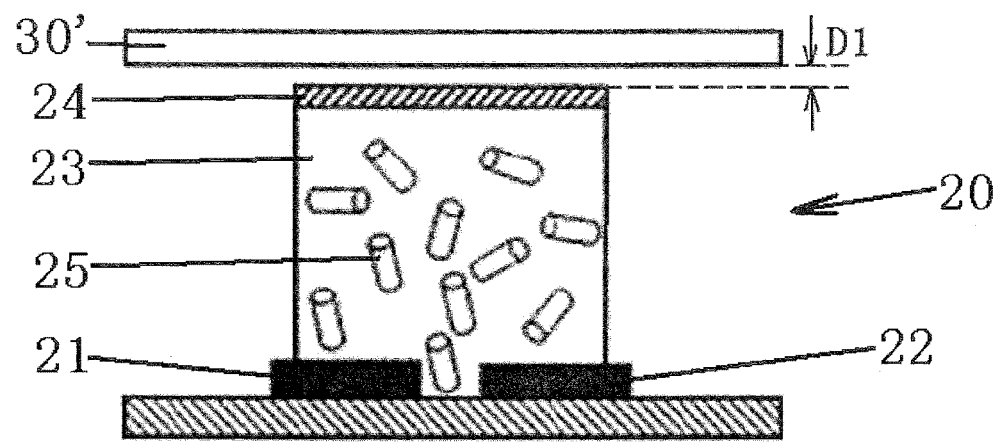
FIG. 3 is a cross sectional view showing principle of the touch sensing unit according to an exemplified embodiment of the present invention, in which the touch panel is not subject to any forces.

FIG. 3 is a cross sectional view showing principle of the touch sensing unit according to an exemplified embodiment of the present invention. Seen from FIG. 3, the touch sensing unit 20 includes a first electrode 21 and a second electrode 22 spaced or separated from each other; an elastic base body 23 arranged on the first electrode 21 and the second electrode 22, the elastic base body 23 containing pressure-sensitive conductive material 25 such as graphene or carbon nanotube, so as to electrically connect the first electrode 21 and the second electrode 22 with each other when the elastic base body 23 is deformed by a force; and a touch panel 30' arranged on the side of the elastic base body 23 to which the force is applied. The touch panel 30' is arranged on the elastic base body 23 to press the elastic base body 23 under an external force.

In an embodiment, as illustrated in FIG. 3, in the case that the touch panel 30' is not be pressed, there is a predetermined distance D1 between the touch panel 30' and the elastic base body 23. For example, the distance D1 may be determined depending on the material deformation characteristic and/or magnetic induction intensity of the touch panel 30'. It should be understood that D1 may be determined as zero as long as the elastic base body 23 is in natural state in which contraction does not occur when the elastic base body 23 is not pressed. If D1 is zero, an insulating layer or film may be provided between the touch panel 30' and the elastic base body 23 to separate them from each other.

In an embodiment, the pressure-sensitive conductive material 25 may be graphene. As a nano-material, the graphene has good light transmittance and is almost transparent completely. Electrons in the graphene have much greater motion speed than that of electrons in conventional conductor. In normal atmospheric temperature, the graphene has very high electron mobility. In particular, the graphene has very low resistivity. However, the pressure-sensitive conductive material 25 is not only limited to the graphene. In an alternative embodiment, the pressure-sensitive conductive material 25 may be at least one of carbon nanotube, conductive black carbon, metal powders and metal fiber or any combination thereof.

As illustrated in FIG. 3, when the elastic base body 23 is in the natural state in which it is not pressed, the pressure-sensitive conductive material 25 such as graphene or carbon nanotube monomer doped in the elastic base body 23 will become in a disordered arrangement and fail to conduct charges. In this case, the electrical insulation is remained between the first electrode 21 and the second electrode 22.

Figure 4:
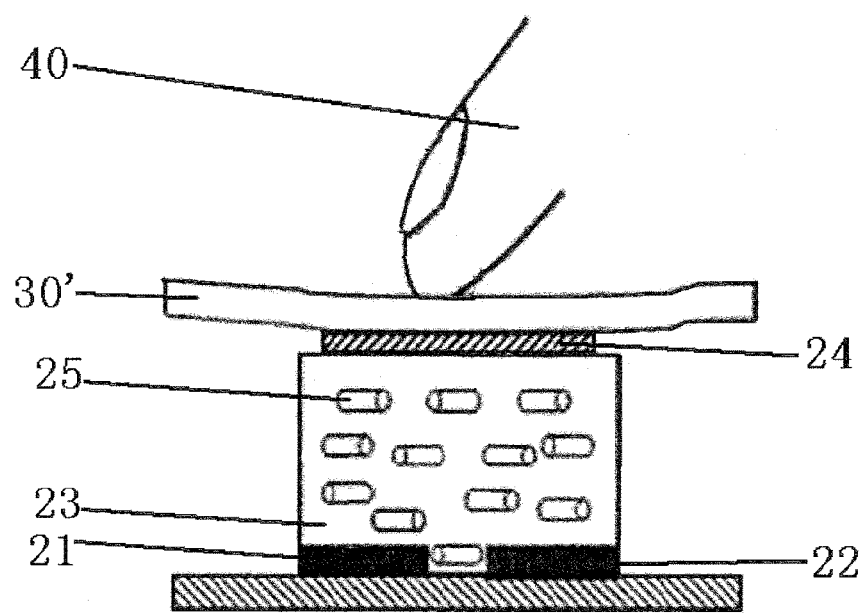
FIG. 4 is a cross sectional view showing principle of conduction of the touch sensing unit shown in FIG. 3 in finger touch state.

As illustrated FIG. 4, when a finger 40 presses the touch panel 30', the elastic base body 23 is in a contracted state in which it is pressed and the graphene or carbon nanotube monomer contained in the elastic base body 23 has or presents an ordered arrangement. Since the graphene or carbon nanotube has good conductivity, the elastic base body 23 doped with the graphene or carbon nanotube 25 becomes to have function of conducting charges and thus the first electrode 21 and the second electrode 22 become electrically connected with each other. In this case, if a voltage signal is applied to the first electrode 21 as a touch transmitting electrode, the second electrode 22 may receive induction voltage signal. In this way, the operation state of the touch panel 30' may be determined rapidly and accurately by detecting whether the second electrode 22 has received the electrical signal, that is, it may be determined whether the touch panel 30' is pressed by the finger 40 or not.

Figure 5:
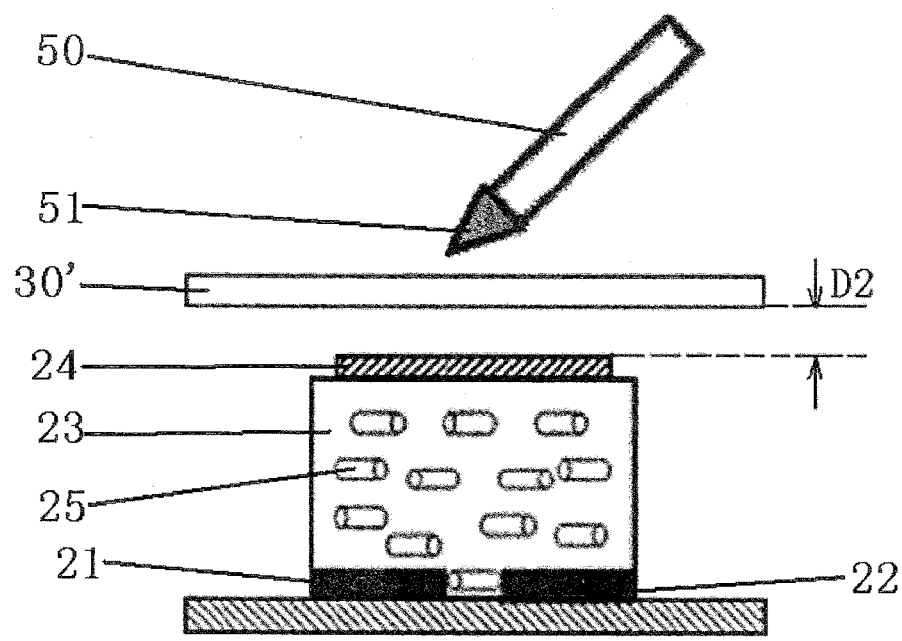
FIG. 5 is a cross sectional view showing principle of conduction of the touch sensing unit shown in FIG. 3 in lettering pen touch state.

The touch sensing unit 20 according to a further exemplified embodiment of the present invention further includes a magnetic triggering layer 24 arranged between the touch panel 30' and the elastic base body 23 and on the side of the elastic base body 23 to which the force is applied, for example, attached to a surface of the elastic base body 23. In this way, as shown in FIG. 5, when a writing operation is performed on the touch panel 30' by an electromagnetic pen 50, a contact head 51 arranged at an end of the electromagnetic pen 50 and made from magnetic material will act to the magnetic triggering layer 24 with each other. As the magnetic material of the magnetic triggering layer 24 is provided in advance to have the same magnetic property as that of the contact head 51, the magnetic field generated by the contact head 51 of the electromagnetic pen 50 will penetrate the touch panel 30' to drive the elastic base body 23 to contract, such that the distance between the touch panel 30' and the elastic base body 23 is increased as D2, as illustrated in FIG. 5. Such as the graphene or carbon nanotube monomer doped in the elastic base body 23 becomes in the ordered arrangement. Since the graphene or carbon nanotube 25 has good conductivity, the elastic base body 23 doped with the graphene or carbon nanotube 25 will have a function of conducting charges and thus the first electrode 21 and the second electrode 22 become electrically connected with each other. By providing the magnetic triggering layer 24 and combining it with the electromagnetic pen 50, input of simulated person's handwritings or strokes may be achieved, which is helpful to input of small icons or small strokes.

At that time, if a voltage signal is applied to the first electrode 21 as the touch transmitting electrode, the second electrode 22 may receive induction voltage signal. In this way, the handwritings of the electromagnetic pen 50 on the touch panel 30' may be determined rapidly and accurately by detecting whether the second electrode 22 has received the electrical signal or not.

In an embodiment, the elastic base body 23 is made from at least one of acryl resin, ethylene propylene rubber, acrylonitrile butadiene rubber, chloroprene rubber and silicon rubber or any combination thereof, such that the elastic base body 23 has good elasticity and produces recoverable deformation in case that it is subject to a force. Furthermore, the touch panel 30' is made from deformable material for forcing the elastic base body 23 to deform once it has been deformed, so as to achieve a touch sensing function. It should be noted that the elastic base body 23 in the present application has property that the electrical conductivity changes due to deformation produced by a force. The embodiments of the present application are not limited to that the deformation is caused by pressing or magnetic field repulsive force. Any other types of cases that the elastic base body 23 deforms by force in contact or non-contact mode also fall within the scope of the present application.

In an alternative embodiment, although FIG. 3 only shows one pair of first electrode 21 and second electrode 22 is provided, a plurality of pairs of first electrodes 21 and second electrodes 22 may be provided to cooperate with an elastic base body to improve touch response speed. It should be understood that the inventive concept of the present invention is explained herein with reference to the arrangement of one pair of first electrode and second electrode and an elastic base body. The skilled person in the art may provide a plurality of the above repetitive structure units from the disclosure of the present invention.

As the first electrode 21 and the second electrode 22 are typically made from opaque metal, the effects of these electrodes to the display may be removed by providing the first electrode and the second electrode as very thin wires. The first electrode 21 and the second electrode 22 may also be made from transparent conductive material.

In an embodiment, the elastic base body 23 contacts both the corresponding first electrode 21 and second electrode 22. In case that the elastic base body 23 is in natural state in which it is not pressed, the pressure-sensitive conductive material 25 such as graphene or carbon nanotube monomer doped in the elastic base body 23 becomes in a disordered arrangement and thus fails to conduct charges. In this case, the electrical insulation is remained between the first electrode 21 and the second electrode 22. When the finger 40 presses the touch panel 30', the elastic base body 23 is in a contracted state in which it is pressed and the graphene or carbon nanotube monomer contained in the elastic base body 23 has an ordered arrangement. Since the graphene or carbon nanotube has good conductivity, the elastic base body 23 doped with the graphene or carbon nanotube 25 becomes to have function of conducting charges and thus the first electrode 21 and the second electrode 22 become electrically connected with each other.

In an embodiment, the touch sensing unit is arranged on a display panel. In the embodiment, the elastic base body 30' is arranged on an inner surface of an upper substrate of the display panel and the first electrode 21 and the second electrode 22 are arranged on an inner surface of a lower substrate of the display panel such that the display panel has a touch sensing function.

Figure 1:
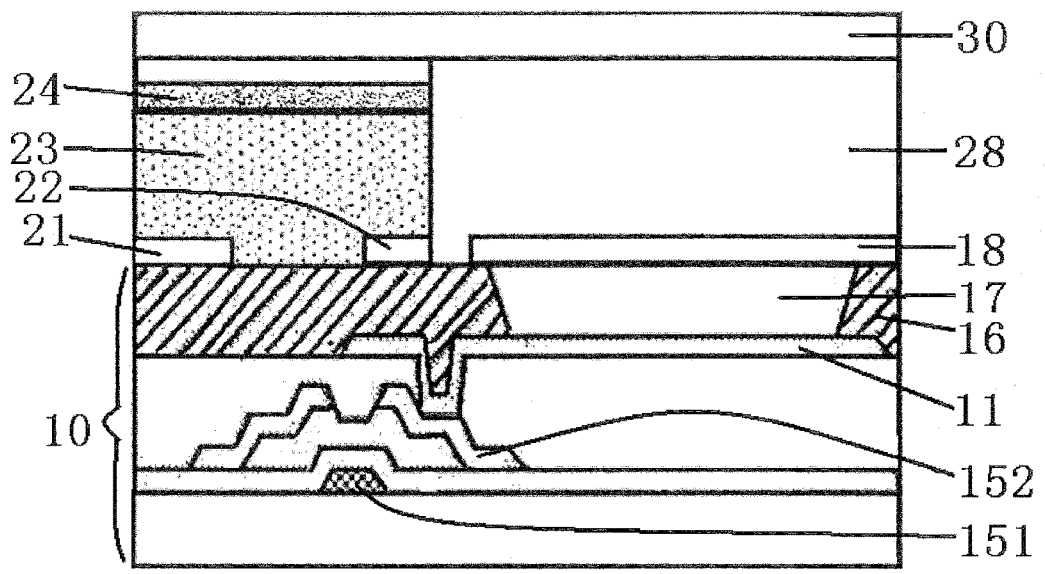
FIG. 1 is a local cross sectional view of a touch substrate according to a first exemplified embodiment of the present invention.
Figure 2:
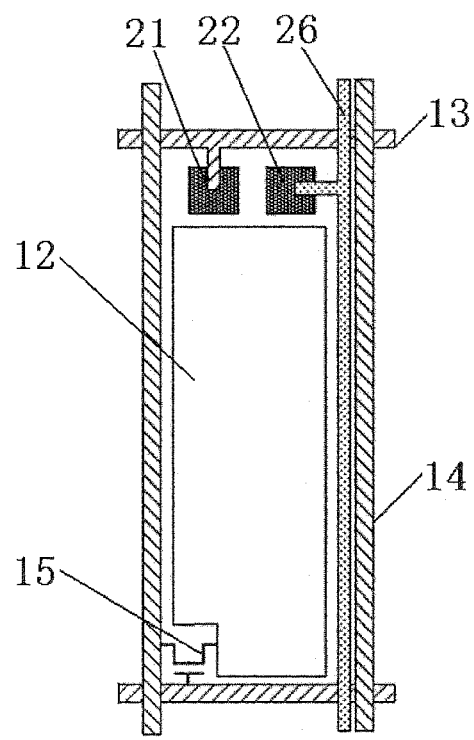
FIG. 2 is a local plan schematic view of an array substrate provided with a touch sensing unit according to the first exemplified embodiment of the present invention.

With reference to FIGS. 1-3, the touch substrate according to an exemplified embodiment of the present invention in particular further includes at least one touch sensing unit as described above and at least one touch transmitting line and at least one touch receiving line. In illustrated embodiment, the touch substrate includes a plurality of the above touch sensing units and a plurality of touch transmitting lines and a plurality of touch receiving lines 26. It will be explained below with reference to an example that each touch sensing unit includes one first electrode 21 and one second electrode 22. Specifically, the first electrode 21 in each touch sensing unit is electrically connected to the corresponding touch transmitting line 26 and the second electrode 22 is electrically connected to the corresponding touch receiving line 26. Herein, in consideration that the above paragraphs have explained the specific structure of the touch sensing unit in detail, its thorough description will be omitted below.

In an alternative embodiment, the touch substrate may include a plurality of pairs of induction electrodes arranged in an array having a plurality of lines and a plurality of rows. Each pair of induction electrodes includes the first electrode 21 and the corresponding second electrode 22 arranged on the array substrate 10 and spaced from each other. Each elastic base body 23 is arranged on the corresponding pair of first electrode 21 and second electrode 22. The elastic base body 23 is doped with the pressure sensitive conductive material 25 such as graphene or carbon nanotube therein, such that the elastic base body 23 is electrically connected to two electrodes in the corresponding pair of first electrode 21 and second electrode 22 in a pressed state. The touch substrate may further include a plurality of touch transmitting lines and a plurality of touch receiving lines 26 for example arranged to cross with each other. The first electrode 21 of each induction electrode is electrically connected to the corresponding touch transmitting line 26 and its second electrode 22 is electrically connected to the corresponding touch receiving line 26. The touch panel 30 is arranged on the elastic base body 23 to apply a pressure to the elastic base body 23 under external force.

The touch substrate in the embodiments of the present invention may be used in all kinds of display panels, such as liquid crystal display panel, OLED display panel, electronic paper display panel, for example, when it is used in the liquid crystal display panel, the touch substrate is provided with a color filtering unit thereon. In this case, the touch panel 30 and the color filtering unit form a color filter substrate, thus, the embodiment of the present invention provides a touch substrate for in cell touch.

In an alternative embodiment, each touch sensing unit has both a plurality of pairs of first electrodes 21 and a plurality of pairs of second electrodes 22, and the first electrodes 21 and the second electrodes 22 are spaced from each other to improve the touch response speed. As the first electrodes 21 and the second electrodes 22 are typically made from opaque metal, the effects of these electrodes to the display may be removed by providing the first electrodes and the second electrodes as very thin wires. In illustrated embodiment, each touch sensing unit has one first electrode and one second electrode.

In an embodiment, the touch substrate further includes a common electrode. The common electrode and the first electrode 21 and second electrode 22 are formed in the same layer by the same transparent conductive material. In this way, the process for producing the first electrode 21 and the second electrode 22 may be reduced.

The touch substrate according to the above embodiment of the present invention may achieve voltage sensing by means of finger touch contraction, or by applying a magnetic repulsive force of the electromagnetic pen to the magnetic triggering layer arranged on the elastic base body to contract the elastic base body, and thus it has double touch sensing function, i.e., the finger touch sensing and the electromagnetic pen touch sensing. As the elastic base body is doped with the pressure sensitive conductive material such as graphene or carbon nanotube, the touch substrate in the embodiment of the present invention has convenience for finger touch sensing, characteristic for multiple point touch sensing and characteristic of accurate operation such as high precision, rapid recording or original handwritings for the electromagnetic pen touch sensing, optimizes the structure of the touch substrate. Thus, the touch substrate may be thinned.

In accordance with another embodiment of the present invention, it provides a touch display panel including the touch substrate as described in the above embodiment, an array substrate and a liquid crystal layer (not shown) between the touch substrate and the array substrate. The array substrate includes: a plurality of gate lines and a plurality of data lines, the gate lines and the data lines being arranged to cross with each other to form a plurality of display units; and a plurality of thin film transistors, each of which is arranged in the corresponding display unit and is electrically connected to the corresponding gate line. In this embodiment, the touch display panel may be used in a thin film transistor liquid crystal display (TFT-LCD).

The touch display panel according to the above embodiment of the present invention may achieve voltage sensing by means of finger touch contraction, or by applying a magnetic repulsive force of the electromagnetic pen to the magnetic triggering layer arranged on the elastic base body to contract the elastic base body, and thus it has double touch sensing function, i.e., the finger touch sensing and the electromagnetic pen touch sensing.

In an embodiment, the array substrate includes a transparent conductive layer or a common electrode. The transparent conductive layer and the first electrode and second electrode are formed by the same layer of transparent conductive material through the only one patterning process. In this way, the process for producing the first electrode 21 and the second electrode 22 may be reduced.

In an embodiment, the array substrate includes a transparent conductive layer or a common electrode, the first electrode and the second electrode are located on the side of the transparent conductive layer from which light is emitted, and the transparent conductive layer and the first electrode are spaced from each other by a transparent insulating layer therebetween and the transparent conductive layer and the second electrode are spaced from each other by a transparent insulating layer therebetween. The gate lines are used as the touch transmitting lines in the touch substrate and electrically connected to one electrode in the corresponding first electrode and second electrode by vias.

The array substrate according to an exemplified embodiment of the present invention may also be used in an organic light emitting diode (OLED) display or an active matrix organic light emitting diode (AMOLED) display. The array substrate will below be explained with reference to the array substrate 10 used in the OLED display.

In an exemplified embodiment, seen from FIGS. 1-2, the array substrate 10 includes: a plurality of transparent common electrodes 18, a plurality of gate lines 13 and a plurality of data lines 14, and a plurality of thin film transistors 15 driven by the gate lines 13. The gate lines 13 and the data lines 14 are arranged to cross with each other to form a plurality of pixel units 12. The common electrodes 18 are provided in the respective display units 12. For example, the display units 12 include red sub-display units R, green sub-display units G and blue sub-display units B arranged in sequence. Each of the thin film transistors 15 is arranged in the corresponding display unit 12 and electrically connected to the corresponding gate line 13 by a gate electrode 151. Each of the thin film transistors 15 has a drain electrode 152 electrically connected to the corresponding pixel electrode 11. In this way, with driven by high level signals on the gate lines 13, the corresponding thin film transistor 15 is conducted so as to transmit the electrical signal on the data lines to the pixel electrode 11.

Further, as illustrated in FIG. 1, in each display unit, an organic emission layer (EML) 17 is provided between the common electrode 18 and the pixel electrode 11 and an insulating layer 16 is arranged around the organic emission layer 17. In an exemplified embodiment, the common electrode 18, the first electrode 21 and the second electrode 22 may be formed by the same transparent conductive material in one patterning process with the same mask. The transparent conductive material includes any one of indium tin oxide (ITO), indium zinc oxide (IZO), indium tin zinc oxide (ITZO) and tin oxide (TO). That is, the common electrode 18, the first electrode 21 and the second electrode 22 are arranged in the same layer and separated from each other. In this way, the process for producing the at least one pair of first electrode 21 and second electrode 22 may be reduced. In addition, a planarization layer 28 made from transparent insulating material is arranged on the common electrode 18 to eliminate the height difference caused by provision of the elastic base body 23 and the magnetic triggering layer 24.

In an exemplified embodiment, the gate lines 13 are used as touch transmitting lines electrically connected to the first electrode 11. That is, the gate lines 13 are not only configured to provide switching signals to the gate electrode 151 of the thin film transistor 15, but also configured to supply touch transmitting signals to the first electrode 21 used as the touch transmitting electrode. In this way, it may reduce the amount of wirings on the array substrate and may further improve efficiency of touch signals process. When the first electrode 21 is electrically connected to the second electrode 22, the driving signals of the gate lines 13 may be transmitted to the touch receiving lines 26. Finger touch or handwritings of the electromagnetic pen can be determined by detecting voltages of the touch receiving lines 26.

Figure 9:
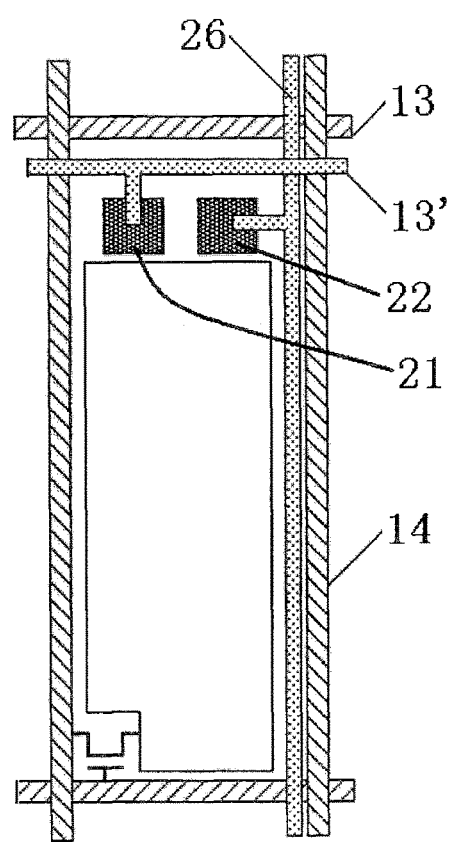
FIG. 9 is a local plan schematic view of an array substrate provided with a touch sensing unit according to the second exemplified embodiment of the present invention.

In an alternative embodiment, as shown FIG. 9, touch transmitting lines 13' are independent from the gate lines 13 and electrically connected to the first electrode 21.

Figures 6, 7:
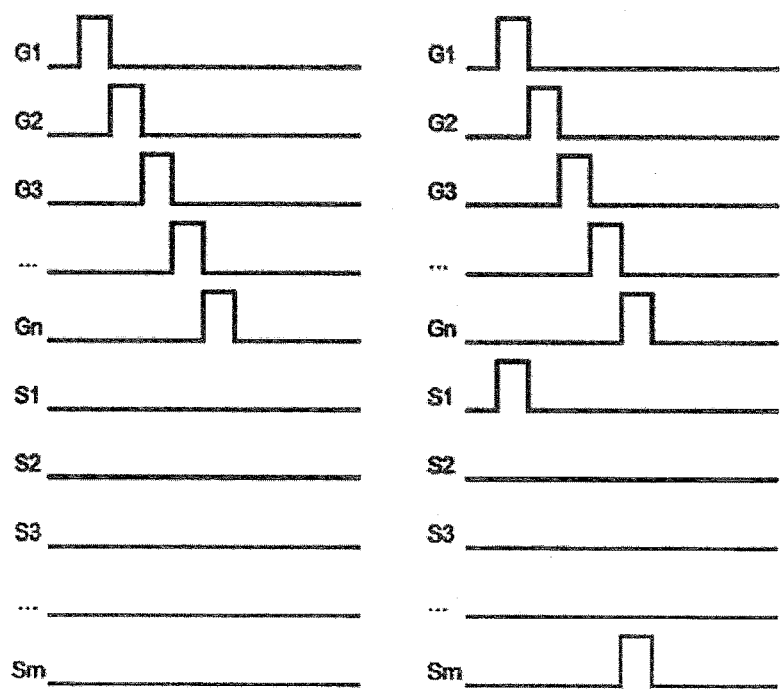
FIG. 6 is a schematic timing diagram showing touch addressing of the touch substrate according to an exemplified embodiment of the present invention in untouched state.
FIG. 7 is a schematic timing diagram showing touch addressing of the touch substrate according to an exemplified embodiment of the present invention in touched state.

FIG. 6 is a schematic timing diagram showing touch addressing of the touch circuit unit according to an exemplified embodiment of the present invention in untouched state; FIG. 7 is a schematic timing diagram showing touch addressing of the touch circuit unit according to an exemplified embodiment of the present invention in touched state.

In FIGS. 6 and 7, G1, G2, G3, ..., Gn represent n rows of gate line scanning signals of the touch substrate, respectively. S1, S2, S3, ..., Sm represent column addressing signals on m touch receiving lines 26, respectively.

Specifically, when the touch substrate displays normally, that is, when there are no actions of finger touch and writing of the electromagnetic pen, as shown in FIG. 6, the gate lines 13 perform periodic scanning by refreshing frequencies and the touch receiving lines 26 connected to the external signal processing units (not shown) cannot detect variations of signals. When there are actions of finger touch and writing of the electromagnetic pen, as shown in FIG. 7, the pulse driving signals of the gate lines 13 may be transmitted to touch receiving lines 26 to generate pulse column addressing signals as the corresponding pair of first electrode and second electrode are electrically connected by graphene or carbon nanotube. The signal processing unit may detect the column addressing signals, so as to determine the actions of finger touch and writing of the electromagnetic pen which occur at the time. However, when the column addressing signals are detected on various touch receiving lines 26 respectively, the sources of these column addressing signals may be positioned respectively by operation of signal processing unit. It can determine the positions where the finger touch and the writings of the electromagnetic pen occur so as to achieve multiple point touch function.

Figure 8:
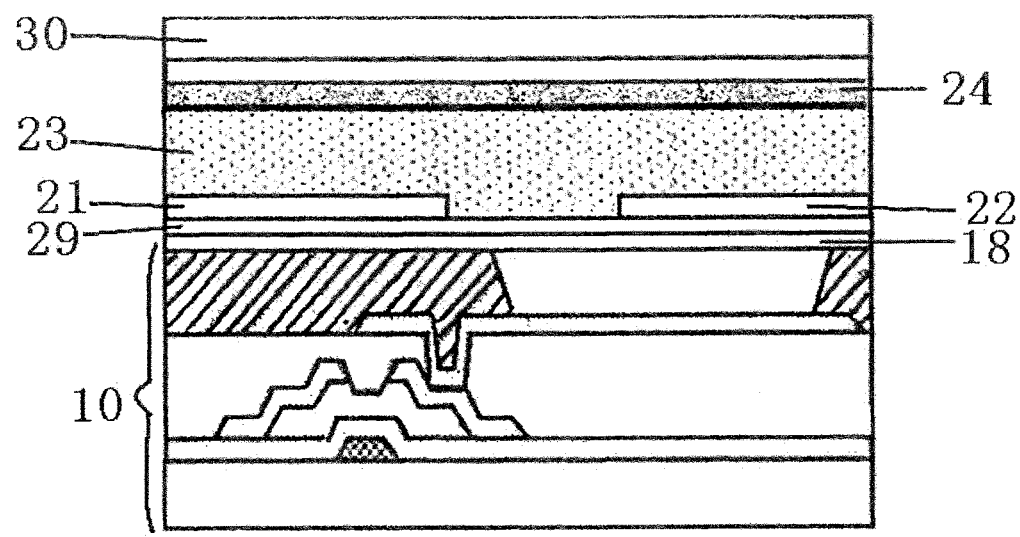
FIG. 8 is a local cross sectional view of a touch substrate according to a second exemplified embodiment of the present invention.

FIG. 8 is a local cross sectional view of a touch substrate according to a second exemplified embodiment of the present invention. As shown in FIG. 8, in the touch substrate of the second embodiment, the common electrode 18 is covered with a transparent insulating layer 29 and the first electrode 21 and the second electrode 22 are arranged on the insulating layer 29 and formed by the same transparent conductive material in one patterning process. That is, the common electrode 18 is arranged on a lower side of the insulating layer 29 and the first electrode 21 and the second electrode 22 are arranged on an upper side of the insulating layer 29. Thus, the crosstalk of the touch sensing unit 20, the first electrode 21 and the second electrode 22 to the common electrode 18 may be reduced. Furthermore, still as illustrated in FIG. 2, the gate lines 13 are used as the touch transmitting lines and are electrically connected to the corresponding first electrode 21 by vias (not shown) formed in the insulating layer 29. The second electrode 22 is electrically connected to the touch receiving lines 26. In an alternative embodiment, as illustrated in FIG. 9, touch transmitting lines 13' are independent from the gate lines 13 and are electrically connected to the first electrode 21.

According to embodiments of another aspect of the present invention, it provides a method for producing a touch substrate, including the following steps of:

forming at least one pair of first electrode 21 and second electrode 22 on a first substrate 10 such as an array substrate, referring to FIGS. 1-4, two electrodes in the pair of first electrode 21 and second electrode 22 being spaced from each other and being electrically connected to the corresponding touch transmitting lines and touch receiving lines provided in the first substrate; depositing an elastic layer, e.g., an acryl resin layer, which is doped with pressure-sensitive conductive material 25 such as graphene or carbon nanotube on the first substrate formed with the at least one pair of first electrode 21 and second electrode 22; patterning the elastic layer by a patterning process to form at least one elastic base body 23; and assembling a second substrate with the first substrate formed with the elastic base body 23. The second substrate may be the touch panel 30 as described in the above embodiments.

In the touch substrate produced by the method according to the above embodiment of the present invention, when a finger 40 presses the second substrate (for example the touch panel 30), the elastic base body 23 is in the contracted state in which it is pressed and graphene or carbon nanotube monometer doped in the elastic base body 23 becomes in an ordered arrangement. As the graphene or carbon nanotube has good electrical conductivity, the elastic base body 23 doped with the graphene or carbon nanotube becomes to have a function of conducting charges and the first electrode 21 and the second electrode 22 become electrically connected to each other. The elastic base body 23 is made from highly elastic acryl resin, which can rapidly and accurately determine whether the touch substrate is in the operation state of being pressed by the finger or not, so as to improve convenience and multiple point touch sensing performance for finger touch.

In an exemplified embodiment, the step of patterning the elastic layer by a patterning process to form a plurality of elastic base bodies 23 includes: depositing a magnetic material layer 24 on the elastic layer; patterning the elastic layer and the magnetic material layer 24 by a patterning process; and polarizing the magnetic material layer 24 by magnet such that the magnetic material layer formed on each elastic base body 23 forms a magnetic triggering layer.

The touch substrate according to the above embodiment of the present invention may achieve voltage sensing by means of finger touch contraction, or by applying a magnetic repulsive force of the electromagnetic pen to the magnetic triggering layer arranged on the elastic base body to contract the elastic base body, and thus it has double touch sensing function, i.e., the finger touch sensing and the electromagnetic pen touch sensing. As the elastic base body is doped with the pressure sensitive conductive material such as graphene or carbon nanotube, the touch substrate in the embodiment of the present invention has convenience for finger touch sensing, characteristic for multiple point touch sensing and characteristic of accurate operation such as high precision, rapid recording or original handwritings for the electromagnetic pen touch, optimizes the structure of the touch substrate. Thus, the touch substrate may be thinned.

In an exemplified embodiment, the step of patterning the elastic layer and the magnetic material layer by a patterning process to form a plurality of elastic base bodies 23 includes: depositing a photo resist (not shown) on the magnetic material layer 24; patterning the elastic layer, the magnetic material layer 24 and the photo resist by carrying out exposing, developing and etching processes using a mask (not shown); and peeling off the photo resist. The touch panel 30 is assembled with the array substrate 20 formed with the elastic layer and the magnetic material layer so as to form the touch substrate according to the embodiment of the present invention.

A surface of an array substrate is ashed by oxygen after the photo resist is peeled off, such that the residual carbon materials react to generate dioxide carbon to improve the performance of touch substrate.

In an exemplified embodiment, the first substrate 10 is an array substrate, and the step of forming at least one pair of first electrode and second electrode on a first substrate 10 includes: forming a common electrode 18 and the first electrode 21 and the second electrode 22 by the same transparent conductive material in one patterning process using the same mask and electrically connecting the gate lines formed on the array substrate to the corresponding first electrode, such that the gate lines are used as the touch transmitting lines. In this way, it may reduce the amount of used masks to reduce the producing process; and may reduce the amount of wirings on the array substrate to improve efficiency of processing touch signals.

In an exemplified embodiment, with reference to FIG. 8, the first substrate 10 is an array substrate, and the step of forming at least one pair of first electrode and second electrode on a first substrate includes: covering a transparent insulating layer 29 on a common electrode 18 of the array substrate 10; forming the first electrode 21 and the second electrode 22 on the insulating layer 29 by the same transparent conductive material in one patterning process; and electrically connecting the gate lines 13 formed on the array substrate 10 to the corresponding one electrode in the at least one pair of first electrode and second electrode by vias (not shown) formed in the insulating layer 29, such that the gate lines are used as the touch transmitting lines. That is, the common electrode 18 is arranged on a lower side of the insulating layer 29 and the first electrode 21 and the second electrode 22 are arranged on an upper side of the insulating layer 29. Thus, the crosstalk of the touch sensing unit 20, the first electrode 21 and the second electrode 22 to the common electrode 18 may be reduced. In addition, it may reduce the amount of used masks to reduce the producing process; and may reduce the amount of wirings on the array substrate to improve efficiency of processing touch signals.

In accordance with a further embodiment of the present invention, it provides a touch display apparatus including the touch substrate as described in any of the above embodiments, and an electromagnetic pen having an end which is provided with a contact head including magnetic material. The magnetic material of the contact head has the same magnetic property as that of the magnetic triggering layer. The touch display apparatus may be any products or components having display function, such as cell phones, tablet computers, TVs, display, notebook computers, digital camera frames, navigators or electronic papers.

The touch sensing unit, the touch substrate and the method for producing the same, the touch display panel and the touch display apparatus according to the above embodiment of the present invention may achieve voltage sensing by means of finger touch contraction, or by applying a magnetic repulsive force of the electromagnetic pen to the magnetic triggering layer arranged on the elastic base body to contract the elastic base body, and thus it has double touch sensing function, i.e., the finger touch sensing and the electromagnetic pen touch sensing. As the elastic base body is doped with graphene or carbon nanotube, the touch substrate in the embodiment of the present invention has convenience for finger touch sensing, characteristic for multiple point touch sensing and characteristic of accurate operation such as high precision, rapid recording or original handwritings for the electromagnetic pen touch sensing, optimizes the structure of the touch substrate. Thus, the touch substrate may be thinned.

Although several exemplary embodiments have been provided to explain the object, solutions and advantages of the present disclosure, it would be appreciated by those skilled in the art that the above embodiments are given by way of examples, instead of limiting the present invention. Various changes, modifications or equivalents made in these embodiments without departing from the principles and spirit of the disclosure will also fall within the scope of the present invention.

What is claimed is:

1. A touch display panel comprising:
   a touch substrate, an array substrate and a liquid crystal layer between the touch substrate and the array substrate, the touch substrate comprising at least one touch sensing unit, the at least one touch sensing unit comprising:
      at least one pair of first electrode and second electrode spaced from each other;
      at least one elastic base body in which pressure-sensitive conductive material is contained, the at least one elastic base body forcing the corresponding first electrode and second electrode in the at least one pair of first electrode and second electrode to be electrically connected with each other when it is deformed by a force; and
      a touch panel arranged on the side of the at least one elastic base body to which the force is applied;
   wherein the array substrate comprises:
      a plurality of gate lines and a plurality of data lines, the gate lines and the data lines being arranged to cross with each other to form a plurality of display units; and
      a plurality of thin film transistors, each of which is arranged in the corresponding display unit and is electrically connected to the corresponding gate line,
   wherein the array substrate comprises a common electrode, and the at least one pair of first electrode and second electrode and the common electrode are formed by a same layer of transparent conductive material in a same patterning process,
   the at least one pair of first electrode and second electrode is located on the side of the common electrode from which light is emitted, and the common electrode and the first electrode of the at least one pair of first electrode and second electrode are spaced from each other by a transparent insulating layer therebetween and the common electrode and the second electrode of the at least one pair of first electrode and second electrode are spaced from each other by a transparent insulating layer therebetween.

2. The touch display panel according to claim 1, the touch sensing unit further comprising a magnetic triggering layer arranged between the touch panel and the at least one elastic base body and on the side of the at least one elastic base body to which the force is applied.

3. The touch display panel according to claim 1, wherein the pressure-sensitive conductive material comprises at least one of graphene, carbon nanotube, conductive black carbon, metal powders and metal fiber or any combination thereof;
   the at least one elastic base body is made from at least one of acryl resin, ethylene propylene rubber, acrylonitrile butadiene rubber, chloroprene rubber and silicon rubber or any combination thereof.

4. The touch display panel according to claim 1, wherein the touch panel is made from deformable material that can be deformed due to application of force and is configured to force the at least one elastic base body to deform once it has been deformed due to the application of force.

5. The touch display panel according to claim 1, wherein the at least one pair of first electrode and second electrode comprises a plurality of pairs of first electrodes and second electrodes, the first electrode and the second electrode in the corresponding pair of first electrode and second electrode being spaced from each other.

6. The touch display panel according to claim 1, wherein the elastic base body contacts with both electrodes of the pair of first electrode and second electrode.

7. The touch display panel according to claim 1, wherein the touch sensing unit is arranged in a display panel, and the at least one elastic base body is arranged on an inner surface of an upper substrate of the display panel, and the first electrode and the second electrode in the at least one pair of first electrode and second electrode are arranged on an inner surface of a lower substrate of the display panel.

8. The touch display panel according to claim 1, further comprising at least one touch transmitting line and at least one touch receiving line, wherein each of the first electrodes is electrically connected to the corresponding touch transmitting line and each of the second electrodes is electrically connected to the corresponding touch receiving line;
   wherein the touch substrate is used in a liquid crystal display panel and is provided with a color filtering unit thereon.

9. The touch display panel according to claim 1, further comprising a common electrode, wherein the common electrode and the at least one pair of first electrode and second electrode are formed by a same transparent conductive material in a same layer; or the common electrode is covered by a transparent insulating layer and the at least one pair of first electrode and second electrode is formed by a same transparent conductive material on the insulating layer in one patterning process.

10. The touch sensing unit according to claim 1, wherein the at least one pair of first electrode and second electrode is arranged to correspond to the at least one elastic base body and the touch panel is spaced apart from the at least one elastic base body.

11. The touch display panel according to claim 1, wherein the gate lines are used as the touch transmitting lines;
   the gate lines are electrically connected to one electrode in the corresponding first electrode and second electrode by vias.

12. A touch display apparatus comprising:
   the touch display panel according to claim 1; and
   an electromagnetic pen having an end which is provided with a contact head including magnetic material, the magnetic material of the contact head having the same magnetic property as that of the magnetic triggering layer.

13. A method for producing a touch substrate, comprising the following steps of:
   forming at least one pair of first electrode and second electrode on a first substrate, the first electrode in the at least one pair of first electrode and second electrode is electrically connected to a corresponding touch transmitting line provided in the first substrate and the second electrode in the at least one pair of first electrode and second electrode is electrically connected to a corresponding touch receiving line provided in the first substrate;
   forming an elastic layer which contains pressure-sensitive conductive material on the first substrate formed with the at least one pair of first electrode and second electrode;
   patterning the elastic layer by a patterning process to form at least one elastic base body; and assembling a second substrate with the first substrate formed with the elastic base body,
   wherein the step of patterning the elastic layer by a patterning process to form at least one elastic base body comprises:
   depositing a magnetic material layer on the elastic layer;
   patterning the elastic layer and the magnetic material layer by a patterning process; and
   polarizing the magnetic material layer by magnet such that the magnetic material layer formed on each elastic base body forms a magnetic triggering layer.

14. The method according to claim 13, wherein the step of patterning the elastic layer and the magnetic material layer by a patterning process comprises:
   depositing a photo resist on the magnetic material layer,
   patterning the elastic layer, the magnetic material layer and the photo resist by carrying out exposing, developing and etching processes using a mask; and
   peeling off the photo resist,
   wherein ashing a surface of an array substrate by oxygen after peeling off the photo resist, such that the residual carbon materials react to generate dioxide carbon.

15. The method according to claim 13, wherein the first substrate is an array substrate, and the step of forming at least one pair of first electrode and second electrode on a first substrate comprises: forming a common electrode and the at least one pair of first electrode and second electrode of the array substrate by a same transparent conductive material in one patterning process and electrically connecting the gate lines formed on the array substrate to the corresponding first electrode, such that the gate lines are used as the touch transmitting lines.

16. The method according to claim 13, wherein the first substrate is an array substrate, and the step of forming at least one pair of first electrode and second electrode on a first substrate comprises:
   covering a transparent insulating layer on a common electrode of the array substrate;
   forming the at least one pair of first electrode and second electrode on the insulating layer by a same transparent conductive material in one patterning process; and
   electrically connecting the gate lines formed on the array substrate to the corresponding first electrode in the at least one pair of first electrode and second electrode by vias formed in the insulating layer, such that the gate lines are used as the touch transmitting lines.

* * * * *